United States Patent
Dal Bianco et al.

(10) Patent No.: US 11,329,618 B2
(45) Date of Patent: May 10, 2022

(54) FULLY DIFFERENTIAL PWM/PFM POWER CONVERTER CONTROL

(71) Applicant: Infineon Technologies AG, Neubiberg (DE)

(72) Inventors: Davide Dal Bianco, Schio (IT); Cristian Garbossa, Bressanone (IT)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 17/028,348

(22) Filed: Sep. 22, 2020

(65) Prior Publication Data

US 2022/0094318 A1 Mar. 24, 2022

(51) Int. Cl.
*H02M 3/156* (2006.01)
*H03F 3/45* (2006.01)

(52) U.S. Cl.
CPC ........ *H03F 3/45475* (2013.01); *H02M 3/156* (2013.01); *H03F 2200/435* (2013.01)

(58) Field of Classification Search
None
See application file for complete search history.

(56) References Cited

U.S. PATENT DOCUMENTS

| | | | |
|---|---|---|---|
| 7,994,853 B2* | 8/2011 | Chao | H03F 3/45475 330/10 |
| 8,810,227 B2 | 8/2014 | Flaibani et al. | |
| 8,917,143 B2* | 12/2014 | Holzmann | H03F 3/2173 330/251 |
| 10,581,325 B1 | 3/2020 | Munroe | |
| 10,756,635 B2* | 8/2020 | Hari | H02M 3/33576 |

(Continued)

FOREIGN PATENT DOCUMENTS

| CN | 204835923 A | 12/2015 |
|---|---|---|
| EP | 3338349 A1 | 6/2018 |
| WO | 2017/030716 A1 | 2/2017 |

OTHER PUBLICATIONS

Franco, S.,"Slope Compensation in PCMC DC-DC Converters," by EDN, accessed from https://www.edn.com/slope-compensation-in-PCMC-DC-DC-Converters/, Mar. 25, 2015, 18 pp.

(Continued)

*Primary Examiner* — Jeffrey A Gblende
(74) *Attorney, Agent, or Firm* — Shumaker & Sieffert, P.A.

(57) ABSTRACT

Differential control circuitry configured to control the operation of a power converter. The control circuitry of this disclosure is configured to receive two differential feedback signals from a fully differential amplifier. The amplifier receives an output voltage (Vout) from the switched mode power supply as well as a reference voltage (Vref). When Vout is less than Vref, the control circuitry may output a pulse width modulation (PWM) control signal to the switched mode power supply with a duty cycle of the PWM control signal based on a relative difference between a positive difference voltage and a negative difference voltage. When Vout is greater than Vref, the control circuitry may output a pulse frequency modulation (PFM) control signal to the switched mode power supply with a switching time of the PFM control signal based on a relative difference between the positive difference voltage and the negative difference voltage.

20 Claims, 12 Drawing Sheets

(56) References Cited

U.S. PATENT DOCUMENTS

| | | |
|---|---|---|
| 2006/0273772 A1 | 12/2006 | Groom |
| 2007/0257651 A1 | 11/2007 | Wrathall |
| 2012/0182003 A1 | 7/2012 | Flaibani et al. |
| 2015/0249385 A1 | 9/2015 | Takahashi |
| 2015/0326123 A1 | 11/2015 | Fukushima et al. |
| 2016/0259355 A1 | 9/2016 | Farber et al. |
| 2017/0201251 A1 | 7/2017 | Chandrasekaran et al. |
| 2019/0131876 A1 | 5/2019 | Luff |

OTHER PUBLICATIONS

Sheehan, R., "Understanding and Applying Current-Mode Control Theory—Practical Design Guide for Fixed-Frequency, Continuous Conduction-Mode Operation," Texas Instruments, Literature No. SNVA555, Power Electronics Technology Exhibition and Conference, Oct. 31, 2007, 30 pp.

Ramus, X., "Demystifying the Operational Transconductance Amplifier," Application Report, SBOA117A, May 2009, Revised Apr. 2013, by Texas Instruments, 13 pp.

\* cited by examiner

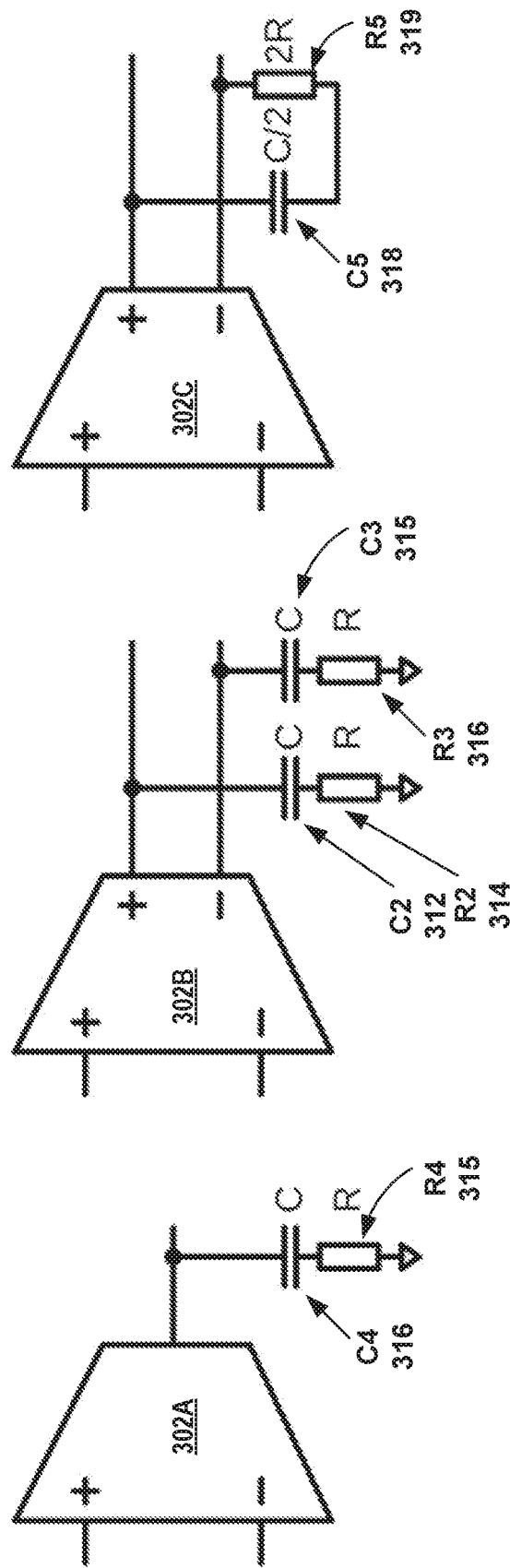

duty-cycle = d = ton/tsw

Vout = average(SW) = vin*d

FULLY DIFFERENTIAL PWM/PFM POWER CONVERTER CONTROL

TECHNICAL FIELD

The disclosure relates to power converters, and more specifically to control circuitry for power converters.

BACKGROUND

A step-down switched mode power converter, such as a buck converter, may use a control loop to regulate the output voltage. The control loop may compare the output voltage with a reference voltage and adjust the output voltage using pulse modulation. In some examples a control loop may use pulse width modulation, and vary the duty cycle, e.g. maintain an approximately constant frequency, or switching time while changing the pulse on-time. In other examples, the control loop may use pulse frequency modulation and vary the switching frequency while maintaining an approximately constant pulse on-time.

SUMMARY

This disclosure describes control circuitry configured to control the operation of a switched mode power supply. In contrast to other such control circuitry, the control circuitry of this disclosure is configured to receive two differential feedback signals from a difference amplifier. The difference amplifier receives an output voltage (Vout) from the switched mode power supply as well as a reference voltage (Vref). The difference amplifier outputs the two differential feedback signals, e.g. a "positive" difference voltage and a "negative" difference voltage, based on a difference between Vout and Vref.

In operation, when Vout is less than Vref, the positive difference voltage is greater than the negative difference voltage, and in response, the control circuitry of this disclosure may output a pulse width modulation (PWM) control signal to the switched mode power supply with a duty cycle of the PWM control signal based on a relative difference between the positive difference voltage and the negative difference voltage. When Vout is greater than Vref, the positive difference voltage is less than the negative difference voltage, and in response, the control circuitry of this disclosure may output a pulse frequency modulation (PFM) control signal to the switched mode power supply with a switching time of the PFM control signal based on a relative difference between the positive difference voltage and the negative difference voltage.

In one example, this disclosure describes a circuit comprising a first input terminal configured to receive a first differential input signal, a second input terminal configured to receive a second differential input signal, a current sink input terminal configured to sink an electrical current based on a relative magnitude between the first differential input signal and the second differential input signal, a peak detected input terminal configured to receive a logical signal from a peak detector circuit, and an output terminal configured to control a power converter. The circuit may be configured to, in response to the first differential input signal being greater than the second differential input signal, sink the electrical current at the current sink input terminal, and output a pulse width modulation control signal at the output terminal. A duty cycle of the PWM control signal may be based on a relative magnitude between the first differential input signal and the second differential input signal. In response to the first differential input signal being less than the second differential input signal, the circuit may be configured to output a pulse frequency modulation control signal at the output terminal, wherein a switching time of the PFM control signal is based on the relative magnitude between the first differential input signal and the second differential input signal.

In another example, this disclosure describes a system comprising a power converter and a dual output difference amplifier configured to: receive an output voltage from the power converter, receive a reference voltage, output a first differential signal, and output a second differential signal. The system also includes a differential control circuit comprising a first input terminal and a second input terminal and configured to: receive the first differential signal at the first input terminal, receive the second differential signal at the second input terminal, and control the operation of the power converter. In response to the first differential signal being greater than the second differential input signal, the differential control circuit outputs a pulse width modulation control signal to the power converter. A duty cycle of the PWM control signal is based on a relative magnitude between the first differential signal and the second differential signal. In response to the first differential signal being less than the second differential signal, output a pulse frequency modulation control signal to the power converter, wherein a switching time of the PFM control signal is based on the relative magnitude between the first differential signal and the second differential signal.

In another example, this disclosure describes a method comprising receiving, by a dual output difference amplifier, an output voltage from a power converter, receiving, by the dual output difference amplifier, a reference voltage, and outputting, by the dual output difference amplifier, a first differential signal and a second differential signal. A magnitude of the first differential signal is based on a relative difference between the output voltage from the power converter and the reference voltage and a magnitude of the second differential signal is based on the relative difference between the output voltage from the power converter and the reference voltage. The first differential signal is greater than the second differential signal when the reference voltage is greater than the output voltage from the power converter. In response to the first differential signal being greater than the second differential signal, outputting a pulse width modulation control signal to the power converter, where a duty cycle of the PWM control signal is based on a relative magnitude between the first differential signal and the second differential signal.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 3A-3C are schematic diagrams illustrating example compensation circuitry for use with power supply control circuitry.

DETAILED DESCRIPTION

This disclosure describes control circuitry configured to control the operation of a switched mode power supply. In contrast to other such control circuitry, the control circuitry of this disclosure is configured to receive two differential feedback signals from a difference amplifier. The difference amplifier receives an output voltage (Vout) from the switched mode power supply as well as a reference voltage (Vref). The difference amplifier outputs the two differential feedback signals, e.g. a "positive" difference voltage (ve_p) and a "negative" difference voltage (ve_n), based on a difference between Vout and Vref. In other words, the control circuitry uses inputs from a fully differential amplifier to control a dc-dc converter.

In operation, when Vout is less than Vref, the positive difference voltage is greater than the negative difference voltage, and in response, the control circuitry of this disclosure may output a pulse width modulation (PWM) control signal to the switched mode power supply with a duty cycle of the PWM control signal based on a relative difference between the positive difference voltage and the negative difference voltage. When Vout is greater than Vref, the positive difference voltage is less than the negative difference voltage, and in response, the control circuitry of this disclosure may output a pulse frequency modulation (PFM) control signal to the switched mode power supply with a switching time of the PFM control signal based on a relative difference between the positive difference voltage and the negative difference voltage.

The techniques of this disclosure may provide several advantages over other switched mode power supply control circuitry, including improved signal-to-noise ratio (SNR), reduced control circuitry jitter, improved DC output voltage quality, simplified control logic requiring less area when implemented on an integrated circuit (IC), a single oscillator, which may reduce current consumption and an improved compensation network.

The control circuitry of this disclosure may be implemented by a variety of techniques including a processor executing software, logic circuitry and similar techniques. In some examples, the control circuitry of this disclosure may be implemented using transconductance circuitry, which may provide a simpler circuitry than may be available with other techniques and consume less current and circuit area at a lower cost when compared to other techniques.

Figure 1A:
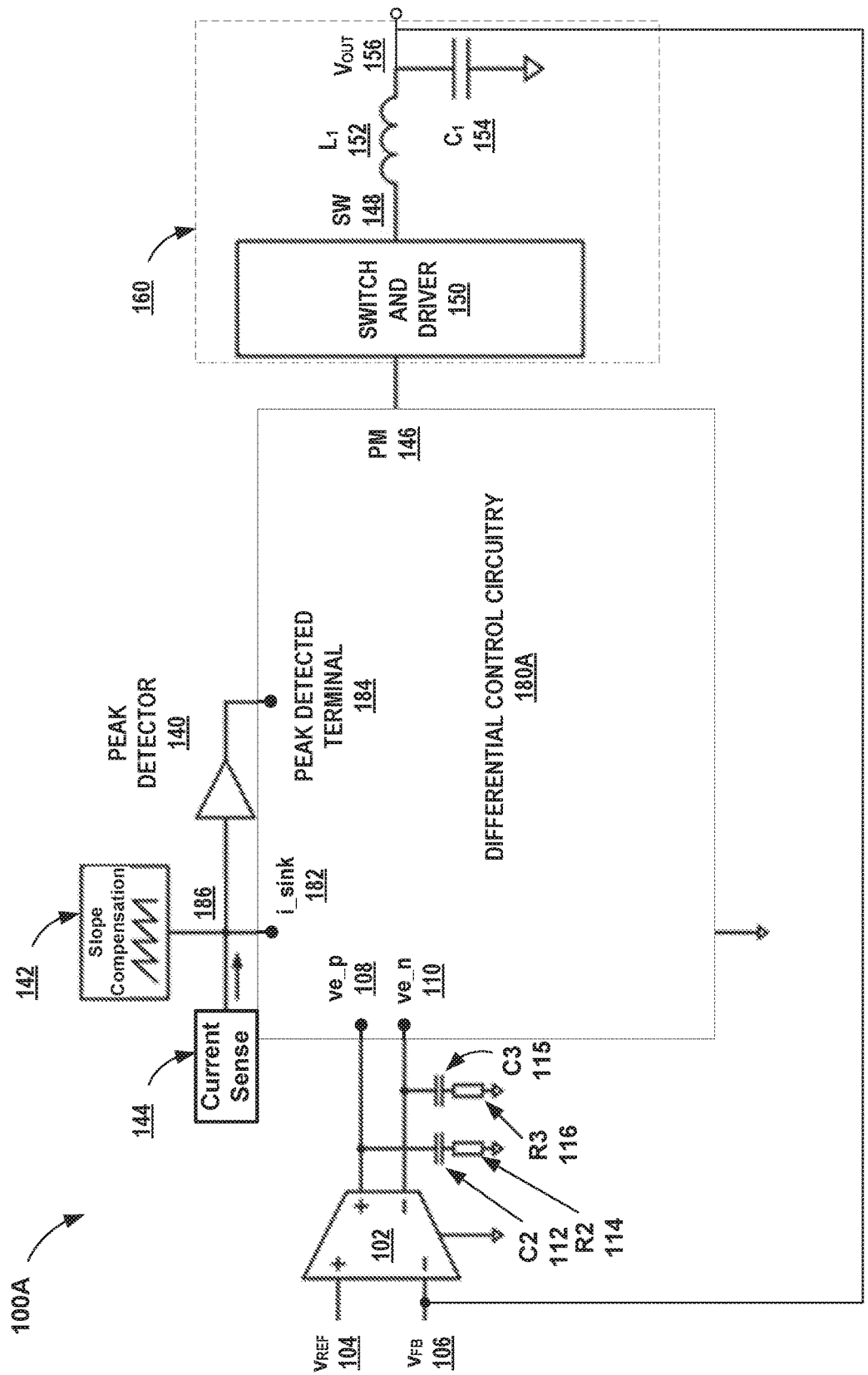
FIG. 1A is a block diagram illustrating example control circuitry for a power converter according to one or more techniques of this disclosure.

FIG. 1A is a block diagram illustrating example control circuitry for a power converter according to one or more techniques of this disclosure. Control circuitry 180A of system 100A uses inputs from a dual output, fully differential amplifier 102 to control a dc-dc converter 160.

In the example of FIG. 1, differential control circuitry 180A includes a first input terminal, ve_p 108, a second input terminal, ve_n 110, current sink input terminal, i_sink 182, peak detected input terminal 184 and output terminal, PM 146. Input terminal ve_p 108 is connected to the positive output of differential amplifier 102 and configured to receive a first differential input signal ve_p from differential amplifier 102. Input terminal ve_n 110 is connected to the negative output of differential amplifier 102 and configured to receive a second differential input signal, ve_n from differential amplifier 102. In this disclosure, differential input signal ve_p from differential amplifier 102 may be described as a "differential input signal" when described in terms of differential control circuitry 180. Differential input signal ve_p, and ve_n, may also be described as a "differential signal" or a "differential output signal" when described in terms of differential amplifier 102. However, the terms "differential input signal," "differential output signal," and "differential signal" may be used interchangeably and should be considered in terms of the context used in this disclosure.

Current sink input terminal, i_sink 182 connects to current summing node 186. Current summing node 186 may also be called a current summing junction. Current sink input terminal, i_sink 182 may be configured to sink an electrical current based on a relative magnitude between the first differential input signal ve_p and the second differential input signal ve_n. Current summing node 186 is also connected to an output of slope compensation circuit 142, to an output of current sense circuit 144 and an input of peak detector 140. The output of slope compensation circuit 142 is a current.

Peak detected input terminal 184 connects to an output of peak detector 140. In some examples, peak detector 140 may also be called a current comparator. Peak detector 140 outputs a logical signal based on the magnitude of current at current summing node 186. Peak detected input terminal 184 is configured to receive the logical signal from peak detector circuit 140.

Output terminal PM 146 of differential control circuitry 180A connects to switch and driver circuitry 150 of power converter 160. Output terminal PM 146 outputs a pulse modulated signal, e.g. pulse width modulated (PWM) and pulse frequency modulated (PFM) to control the operation of power converter 160, based, at least in part on the difference between the magnitude of the output voltage at output terminal Vout 156 and reference voltage Vref 104.

Power converter 160, in the example of FIG. 1A comprises a DC-DC buck converter. Power converter 160 may also be described as a dc-dc power converter and a switched mode power converter. Power converter 160 includes switch and driver circuitry 150, which receives a control signal at an input terminal connected to output terminal PM 146 of differential control circuitry 180A. Switch and driver circuitry 150 connects to a first terminal of inductor L1 152 at switch node SW 148. A second terminal of inductor L1 152 connects to output terminal Vout 156 and to a first terminal of output capacitor C1 154. A second terminal of C1 154 connects to circuit ground. Vout 156 connects to the inverting input, e.g. the negative input terminal, of differential amplifier 102. Differential amplifier 102 may also be referred to as difference amplifier 102 in this disclosure.

The outputs of differential amplifier 102 connect to a compensation network comprising capacitor C2 112, resistor R2 114, capacitor C3 115 and resistor R3 116. The non-inverting, e.g. positive output of difference amplifier 102 connects to system ground through a series connection of capacitor C2 112 and R2 114. The inverting, e.g. negative output of difference amplifier 102 connects to system ground through a series connection of capacitor C3 115 and R3 116. The compensation network is configured to control the response time and stability of the circuit based on the selected values of capacitor C2 112, resistor R2 114, capacitor C3 115 and resistor R3 116. In this disclosure, the compensation network may also be referred to as a compensation unit. The function of slope compensation circuit 142, e.g. as part of peak current control during PWM mode of differential control circuitry 180A, should not be confused with the compensation unit comprising capacitor C2 112, resistor R2 114, capacitor C3 115 and resistor R3 116.

In operation, the pulse modulated output from output terminal PM 146 of differential control circuitry 180A may control power converter 160 to increase Vout 156 when Vout 156 is too low, e.g. less than Vref 104, and to decrease Vout 156, when Vout 156 is too high, e.g. more than Vref 104. Difference amplifier 102 receives output voltage, Vout 156 as a feedback voltage, e.g. Vfb 106, from the switched mode power supply as well as a reference voltage Vref 104. A magnitude of the first differential input signal, ve_p 108 may be based on a relative difference between the output voltage, e.g. Vout 156 from power converter 160 and reference voltage Vref 104. Similarly, a magnitude of the second differential input signal ve_n 110 may be based on the relative difference between output voltage Vout 156 and reference voltage Vref 104. In some examples, ve_p 108 is greater than ve_n 110 when reference voltage Vref 104 is greater than Vfb 106, e.g. output voltage Vout 156.

Differential control circuitry 180A may receive the first differential input signal, ve_p 108 and second differential input signal, ve_n 110 from difference amplifier 102. In some examples, ve_p 108 is greater than the second differential input signal ve_n 110. In other words, ve_p 108>ve_n 110 because Vref 104>Vfb 106, i.e. the output voltage, Vout 156 is too low. In response to ve_p 108 being greater than ve_n 110, differential control circuitry may sink an electrical current from current summing node 186 at current sink input terminal i_sink 182. The magnitude of the electrical current may depend on the relative difference between ve_p 108 and ve_n 110.

Differential control circuitry 180A may also output a pulse width modulation control signal at output terminal PM 146. In some examples, a duty cycle of the PWM control signal is based on a relative magnitude between ve_p 108 and ve_n 110.

In other examples, ve_p 108 may be less than ve_n 110. In other words, ve_p 108<ve_n 110 because Vref 104<Vfb 106, e.g. Vout 156 is too high. In response to ve_p 108<ve_n 110, differential control circuitry 180A may output a pulse frequency modulation control signal at output terminal PM 145. A switching time of the PFM control signal to power converter 160 may be based on the relative magnitude between ve_p 108 and ve_n 110. Said another way, the PFM switching time may be based on a magnitude of the difference between ve_p 108 and ve_n 110.

In some examples, differential control circuitry 180A may also prevent current sink input terminal, i_sink 182, from sinking electrical current from current summing node 186. In other words, the current from current summing node 186 to i_sink 182 may be set to approximately zero amps. In this disclosure, "approximately zero" means no current, or zero current, except for some possible small leakage current that has no impact on the circuit operation. In other words, "approximately zero" means no current within manufacturing and measurement tolerances. In response to zero electrical current from current summing node 186 into i_sink 182, the logical signal from the output of peak detector circuit 140 may be set to a logical ONE.

In some examples, the functions of differential control circuitry 180A, may be implemented with processing circuitry. In other examples, the functions described above may be implemented in hardware, software, firmware, or any combination thereof. For example, the various components of FIG. 1, including slope compensation 142, peak detector 140 and so on, may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements. For example, differential control circuitry 180 may be implemented by a combination of a microprocessor, clocks, switches, and passive components in various combinations.

Figure 1B:
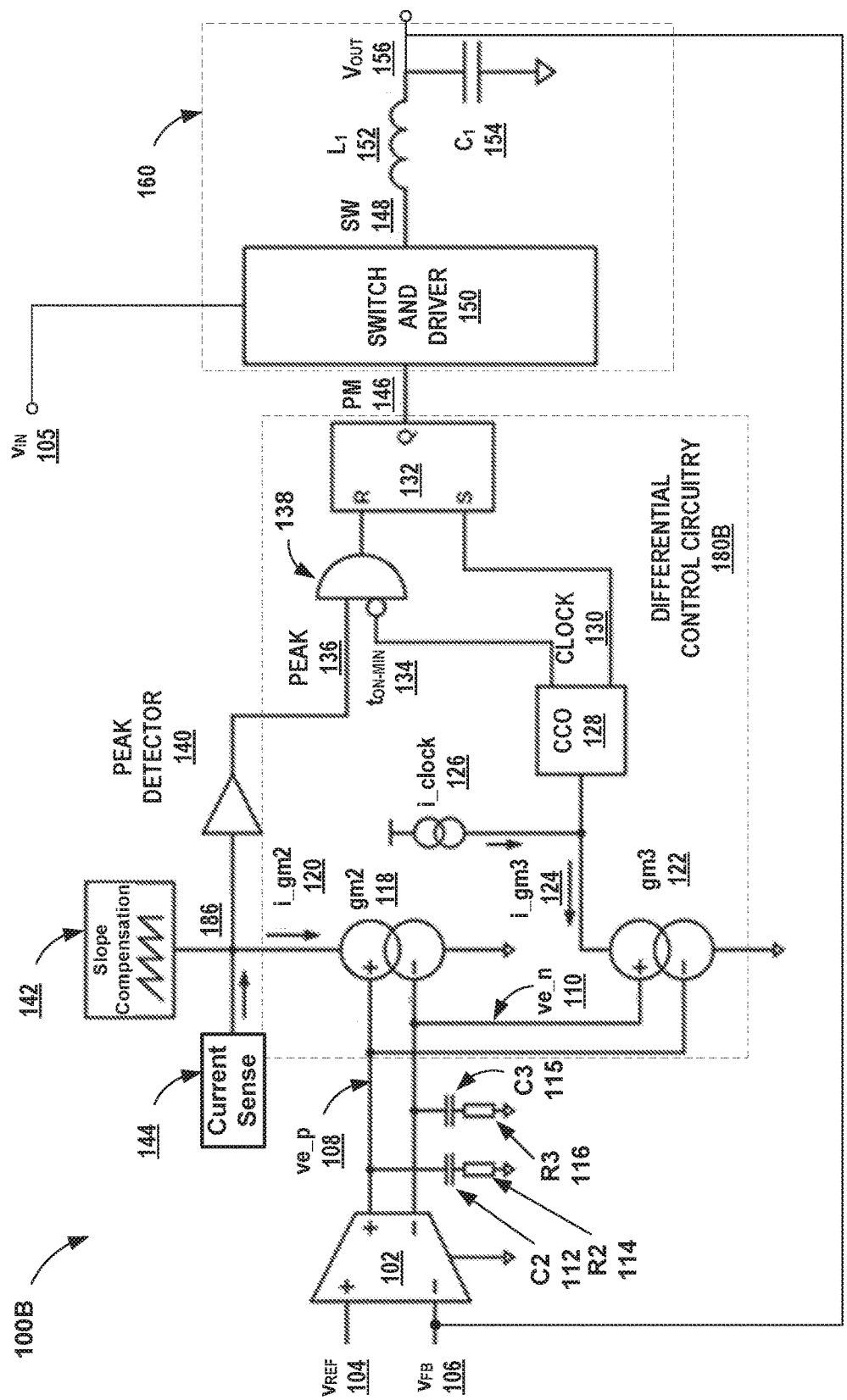
FIG. 1B is a schematic diagram illustrating an example implementation of control circuitry for a power converter according to one or more techniques of this disclosure.

FIG. 1B is a schematic diagram illustrating an example implementation of control circuitry for a power converter according to one or more techniques of this disclosure. System 100B is an example of system 100A described above in relation to FIG. 1A. Difference amplifier 102, current sense 144, summing node 186, slope compensation 142, peak detector 140, differential control circuitry 180B, ve_p 108, ve_n 110, and power converter 160 may have the same functions and characteristics as described above in relation to FIG. 1A.

Figure 2:
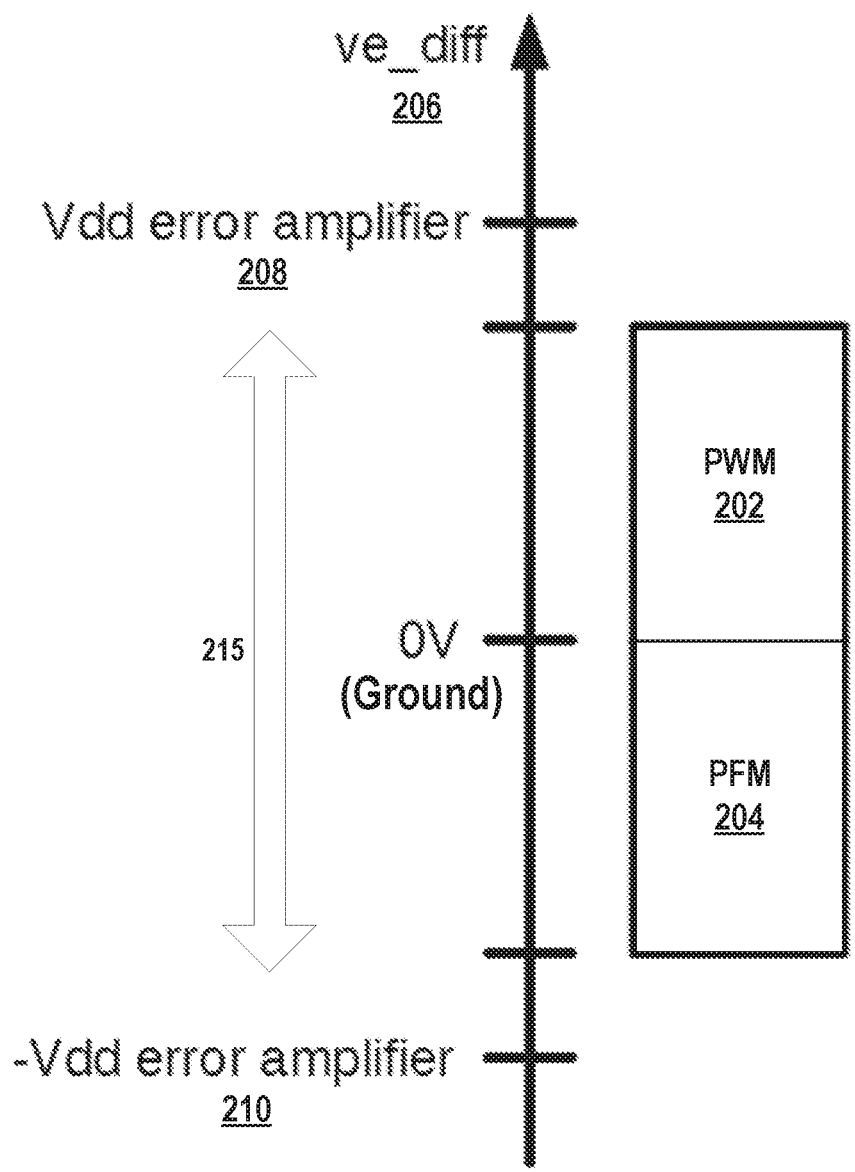
FIG. 2 is a conceptual diagram illustrating an example operation of the power converter control circuitry of this disclosure.

For differential control circuitry 180B in the example of FIG. 2, input terminal ve_p 108 is connected to the positive output of differential amplifier 102 and configured to receive the first differential input signal ve_p from differential amplifier 102. Input terminal ve_n 110 is connected to the negative output of differential amplifier 102 and configured to receive the second differential input signal, ve_n from differential amplifier 102. The current sink input terminal connected to current summing node 186 connects to the input of a first transconductance unit, gm2 118. The peak detected input terminal is a non-inverting input to AND gate 138 and connects to the output of peak detector 140. Output terminal, PM 146 is a Q output of RS flip-flop 132.

Transconductance unit gm2 118 is circuitry configured to sink the electrical current at the current sink input terminal connected to current summing node 186. Transconductance unit gm2 118, and transconductance unit gm3 122 are transconductance circuits that may also be referred to as transconductor gm2 118 and transconductor gm3 122 in this disclosure.

A non-inverting or positive input terminal of transconductance unit gm2 118 connects to ve_p 108 and an inverting or negative input terminal of transconductance unit gm2 118 connects to ve_n 110. In response to the first differential input signal from ve_p 108 being greater than the second differential input signal from ve_n 110, transconductance unit gm2 118 sinks the electrical current i_gm2 120 from current summing node 186. In response to the first differential input signal from ve_p 108 being less than the second differential input signal from ve_n 110, transconductance unit gm2 118 shuts off and does not sink electrical current from current summing node 186, e.g., i_gm2 120=0. While transconductance unit gm2 118 is activated and sinking current i_gm2 120, a duty cycle of the PWM control signal at output terminal 146 is based on the magnitude of the electrical current i_gm2 120 through the first transconductance unit gm2 118. The magnitude of i_gm2 120 depends on the relative difference between the first differential input signal from ve_p 108 and the second differential input signal from ve_n 110, e.g., $$ve\_diff = ve\_p - ve\_n$$

Transconductance unit gm3 122 is also circuitry configured to sink electrical current, i_gm3 124. A non-inverting or positive input terminal of transconductance unit gm3 122 connects to ve_n 110 and an inverting or negative input terminal of transconductance unit gm3 122 connects to ve_p 108. Therefore, transconductance unit gm3 122 is configured to conduct i_gm3 124 when transconductance unit gm2 118 is deactivated, and vice versa. In other words, the second transconductance unit gm3 122 is configured to sink electrical current i_gm3 124 in response to the first differential input signal from ve_p 108 being less than the second differential input signal from ve_n 110. Similar to gm2 118, the magnitude of the second electrical current i_gm3 124 is based on the relative magnitude between ve_p 108 and and ve_n 110. When the first differential input signal from ve_p 108 is greater than the second differential input signal from ve_n 110, the magnitude of the second electrical current i_gm3 124=0. As with transconductance unit gm2 118, in some examples, transconductance unit gm3 122 may conduct some small amount of current caused by leakage or other physical factors of the circuit when deactivated, which may not impact the circuit function.

An output terminal of transconductance unit gm3 122 connects to current controlled oscillator (CCO) 128 as well as a constant current source i_clock 126. Electrical current at the input of CCO 128 is a combination of the current from i_clock 126 and i_gm3 124 through transconductance unit gm3 122. In the example of system 100B, CCO 128 includes two output terminals, a logical output $t_{ON\_MIN}$ 134 and clock 130. The magnitude of i_gm3 124 modulates the frequency of the clock signal from clock 130. In other words, transconductance unit gm3 modulates the frequency of the clock signal from clock 130 down to 0 Hz if i_gm3 124 is greater than i_clock 126. Clock 130 connects to the SET input (S) of RS flip-flop 132.

In the example of system 100B, CCO 128 is also configured to output $t_{ON\_MIN}$ 134 to an inverting input of AND gate 138. The output of AND gate 138 connects to the reset (R) input of RS flip-flop 132. The signal $t_{ON\_MIN}$ 134 may be implemented in several ways, e.g. digital delay circuitry, RC circuit timing, as well as other techniques. In other examples, circuitry to generate $t_{ON\_MIN}$ 134 may be implemented in differential control circuitry 180B by a circuit separate from CCO 128. The signal $t_{ON\_MIN}$ 134 provides a constant value for a minimum on-time at output terminal PM 146 to converter 160.

As described above in relation to FIG. 1A, the outputs of difference amplifier 102 connect to a compensation network comprising capacitor C2 112, resistor R2 114, capacitor C3 115 and resistor R3 116. The non-inverting, e.g. positive output of difference amplifier 102 connects to system ground through a series connection of capacitor C2 112 and R2 114. The inverting, e.g. negative output of difference amplifier 102 connects to system ground through a series connection of capacitor C3 115 and R3 116.

In operation, the two transconductance units gm2 118 and gm3 122 may be connected with opposite signs. When ve_diff is positive (Vout 156 is too low), then ve_p>ve_n, thus gm2 118 generates a current which provides reference for PWM control of power converter 160, using peak current control. Peak current control is provided by the signal from peak detector 140, e.g. peak 136, at the peak detected terminal of differential control circuitry 180B. The signal, peak 136 is determined by the peak detector based on the current at summing node 186 provided by slope compensation circuit 142, the current provided by current sense 144 and i_gm2 120 into the current sink terminal, and may help avoid subharmonic oscillations in the PWM control signal.

Also, when ve_diff is positive, transconductance unit gm3 122 receives a negative input voltage, and its current i_gm3 124 is equal to zero. In this condition, CCO 128 outputs a constant frequency clock, determined by constant current from i_clock 126, connected to the control terminal of CCO 128. Because of a fixed clock frequency at clock 130 to the S-input of RS flip-flop 132, and a duty-cycle modulated by the peak current control at the R-input of flip-flop 132, differential control circuit 180B operates dc-dc power converter 160 in PWM mode.

When ve_diff is negative, e.g., ve_p<ve_n and Vout 156 is more than Vref 104, then gm2 118 will receive a negative input voltage from ve_p 108 and ve_n 110 causing i_gm2 120 to be zero amps. Consequently, peak detector output signal 140, which monitors the currents at summing node 186, will be always output a logic ONE to AND gate 138 via peak 136. Transconductance unit gm3 122 will receive a positive input voltage, and sink i_gm3 124 in proportion to the magnitude of the difference between the first differential input signal ve_p and the second differential input signal ve_n. Because input current of the CCO is the difference between i_clock 126 and i_gm3 124, the clock frequency at clock 130 to the S-input of RS flip-flop 132 is modulated by transconductance unit gm3 122 down to 0 Hz, while i_gm3 124>i_clock 126. In other words, transconductance unit gm3 122 modulates the clock frequency output at clock 130 while the magnitude of i_gm3 124 dominates the input current of CCO 128 over the constant current from i_clock 126. Because of the constant on time equal from CCO 128 to AND gate 138 via ton_min 134, and the modulated switching frequency from clock 130, differential control circuitry 180B operates dc-dc power converter 160 in PFM mode.

FIG. 2 is a conceptual diagram illustrating an example operation of the power converter control circuitry of this disclosure. The example of FIG. 2 describes the operation of differential control circuitry 180A and 180B described above in relation to FIGS. 1A and 1B and will be described in terms of FIG. 1B, unless otherwise noted.

When ve_diff 206 is greater than zero, i.e., ve_p is greater than ve_n because Vfb 106 is less than Vref 104 at differential amplifier 102, differential control circuitry 180B may operate power converter 160 in pulse width modulation mode, e.g. in region PWM 202 of FIG. 2. When ve_diff 206 is less than zero, i.e., ve_p is less than ve_n because Vfb 106 is more than Vref 104 at differential amplifier 102, differential control circuitry 180B may operate power converter 160 in pulse frequency modulation mode, e.g. in region PFM 204. The output range 215, or output voltage swing of ve_diff 206 may depend on the architecture and design of differential amplifier 102 and may be limited to a range between the power supply inputs to differential amplifier 102, e.g. Vdd 208 and minus Vdd 210.

FIGS. 3A-3C are schematic diagrams illustrating example compensation circuitry for use with power supply control circuitry. In some examples, a fully differential architecture may allow using half of the capacitor and double the resistor with respect to the single-ended approach. On an integrated circuit, a capacitor may be bigger than the resistor. Therefore, by reducing the capacitor, the fully differential approach may result in less area consumed on an integrated circuit for the compensation network.

In FIG. 3A, amplifier 302A includes an inverting input, a non-inverting input and single output. The compensation circuitry for FIG. 3A includes capacitor C4 316 with capacitance value C farads, connected in series to ground through resistor R4 315 with impedance value R ohms.

A similar differential amplifier 302B in FIG. 3B may include a compensation network comprising capacitor C2 312, resistor R2 314, capacitor C3 315 and resistor R3 316. Differential amplifiers 302B and 302C are examples of differential amplifiers 102 described above in relation to FIGS. 1 and 2. The non-inverting, e.g. positive output of differential amplifier 102 connects to system ground through a series connection of capacitor C2 112, with capacitance C farads and R2 114, with resistance of R ohms. The inverting, e.g. negative output of difference amplifier 102 connects to system ground through a series connection of capacitor C3 115, also with capacitance C farads, and R3 116, also with resistance of R ohms. Because the compensation circuitry of differential amplifier 302B connects to ground, an equivalent circuit for FIG. 3B may depicted as shown in FIG. 3C.

The positive output of differential amplifier 302C connects to the negative output through a series connection of capacitor C5 318 and resistor R5 319. The series combination of components means that C5 318 may be implemented with a capacitance of half that of capacitors C4 316 and C2 312 depicted in FIGS. 3A and 3B, e.g. a capacitance of ½C farads. Resistor R5 319 may be implemented with a resistance of double that of resistors R4 315 and R2 314, e.g. a resistance of 2R ohms. In this manner, the compensation circuit of FIG. 3C may consume less area on an integrated circuit, when compared to FIGS. 3A and 3B, yet provide the same compensation performance, within manufacturing and measurement tolerances.

Figure 3D:
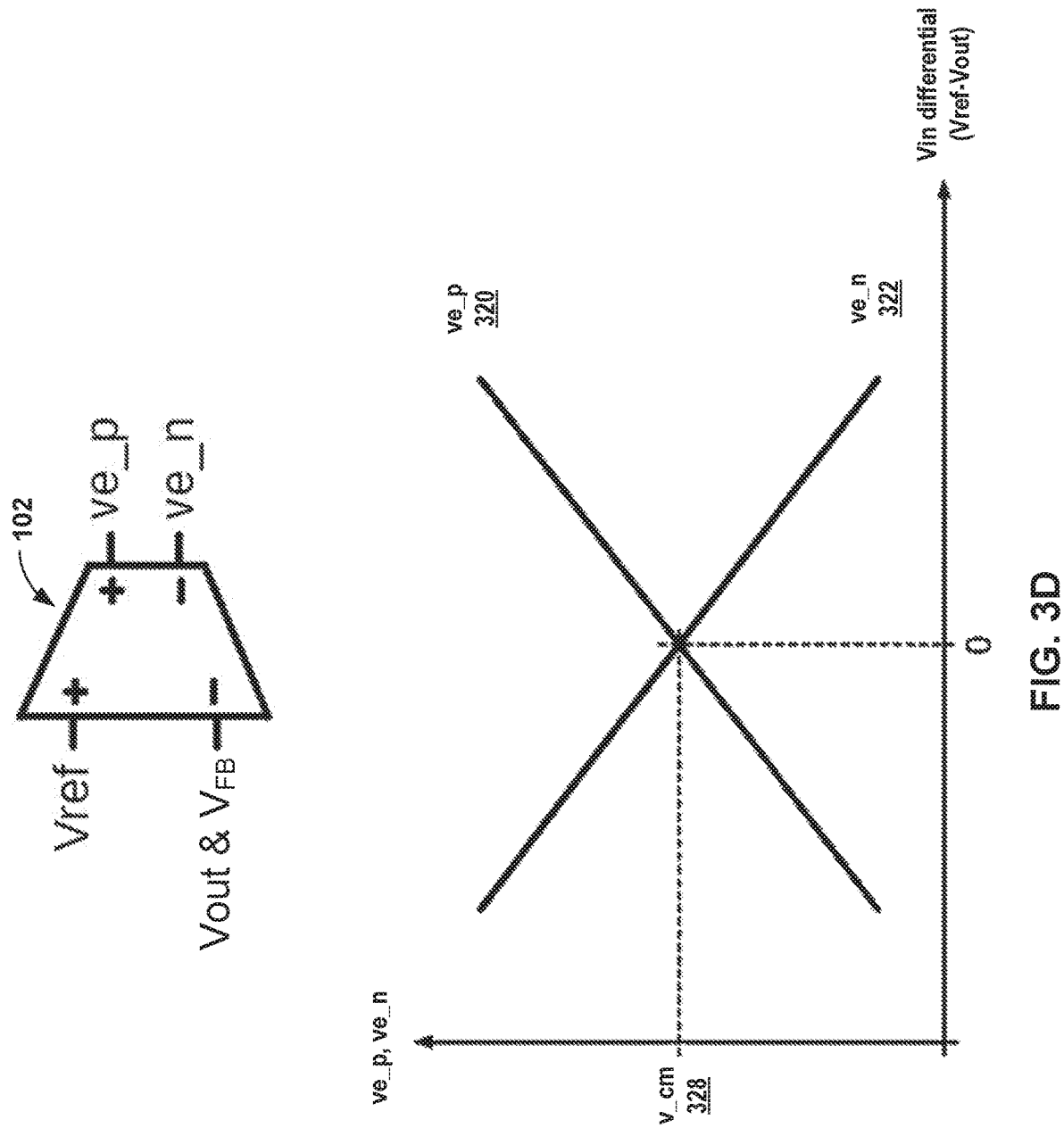
FIG. 3D includes a graph illustrating an example operation for the differential amplifier of this disclosure.

FIG. 3D includes a graph illustrating an example operation for the differential amplifier of this disclosure. Differential amplifier 302 in FIG. 3D is an example of differential amplifiers 102 described above in relation to FIGS. 1A, 1B and 2. The inputs to differential amplifier 102 are Vref, at the non-inverting input, and Vout, or feedback voltage Vfb, at the inverting input.

The common mode voltage, v_cm 328, is a design parameter of differential amplifier 302. Common mode voltage v_cm 328, along with a gain (g) of differential amplifier 302 may depend on the differential amplifier topology and may be selected to fit design constraints for the application for which the amplifier is to be used. Common mode voltage v_cm 328, does not affect the differential output of differential amplifier 302.

The graph of FIG. 3D depicts the behavior of ve_p 320 and ve_n 322 as the differential voltage (ve_diff=Vref−Vout) changes. In some examples, ve_diff may be referred to as an error voltage, e.g., the error of Vout compared to Vref. The graph depicted in FIG. 3D may be described by the following equations:

$$ve\_p = v\_cm + g*(Vref - Vout)$$

$$ve\_n = v\_cm + g*(Vout - Vref)$$

$$ve\_diff = (ve\_p - ve\_n) = g*(Vref - Vout).$$

Figure 4A:
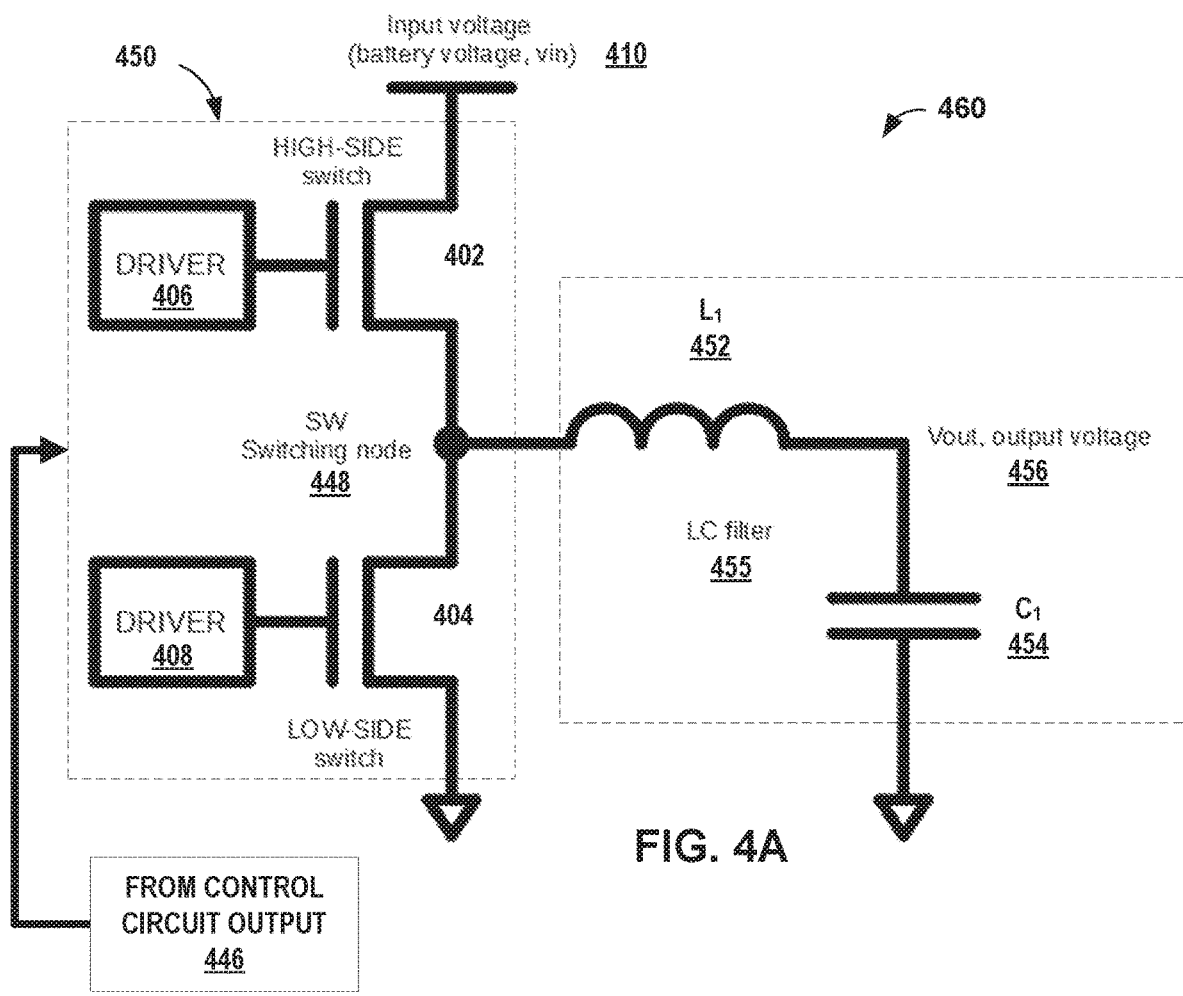
FIG. 4A is a schematic diagram illustrating example driver and switching circuitry for a buck power converter.

FIG. 4A is a schematic diagram illustrating example driver and switching circuitry for a buck power converter. In some examples, power converter 460 may correspond to power converter 160 described above in relation to FIGS. 1A and 1B.

In the example of FIG. 4A, power converter 460 includes driver and switching circuitry 450 and an LC filter 455 including inductor L1 452 connected in series with capacitor C1 454. Output voltage 456 is located at a node between L1 452 and C1 454. LC filter 455 connects to driver and switching circuitry 450 at switching node 448, located between high side switch 402 and low side switch 404. Driver 406 and 408 may include amplifiers, and other circuitry configured to drive high side switch 402 and low side switch 404. High side switch 402 is connected in series with low side switch 404 between an input voltage 410 and a circuit ground.

Driver and switching circuitry 450 may receive a pulse modulated control signal from a control circuit output 446, which may correspond to output terminal PM 146 described above in relation to FIG. 1B. As described above in relation to FIGS. 1A-2, when Vout is less than Vref, the control signal may be a pulse width modulated signal. When Vout is greater than Vref, e.g. ve_diff less than zero, the control signal may be a pulse frequency modulated signal.

Figure 4B:
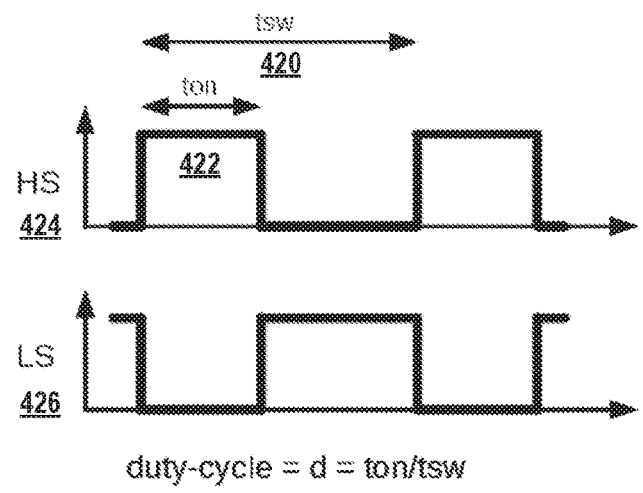
FIG. 4B is a timing diagram illustrating an example gate signals for the switching circuitry depicted in FIG. 4A.

FIG. 4B is a timing diagram illustrating an example gate signals for the switching circuitry depicted in FIG. 4A. FIG. 4B depicts an example low side gate control signal 426 and a high side gate control signal 424. High side gate control signal 424 depicts the duty cycle, d, shown as torr 422 divided by the period, $t_{SW}$ 420. An average output voltage, Vout 456 may be described according to the following equations:

$$\text{duty cycle} = d = \frac{t_{ON}}{t_{SW}}$$

$$Vout = \text{average (SW)} = Vin \times d$$

Figure 5:
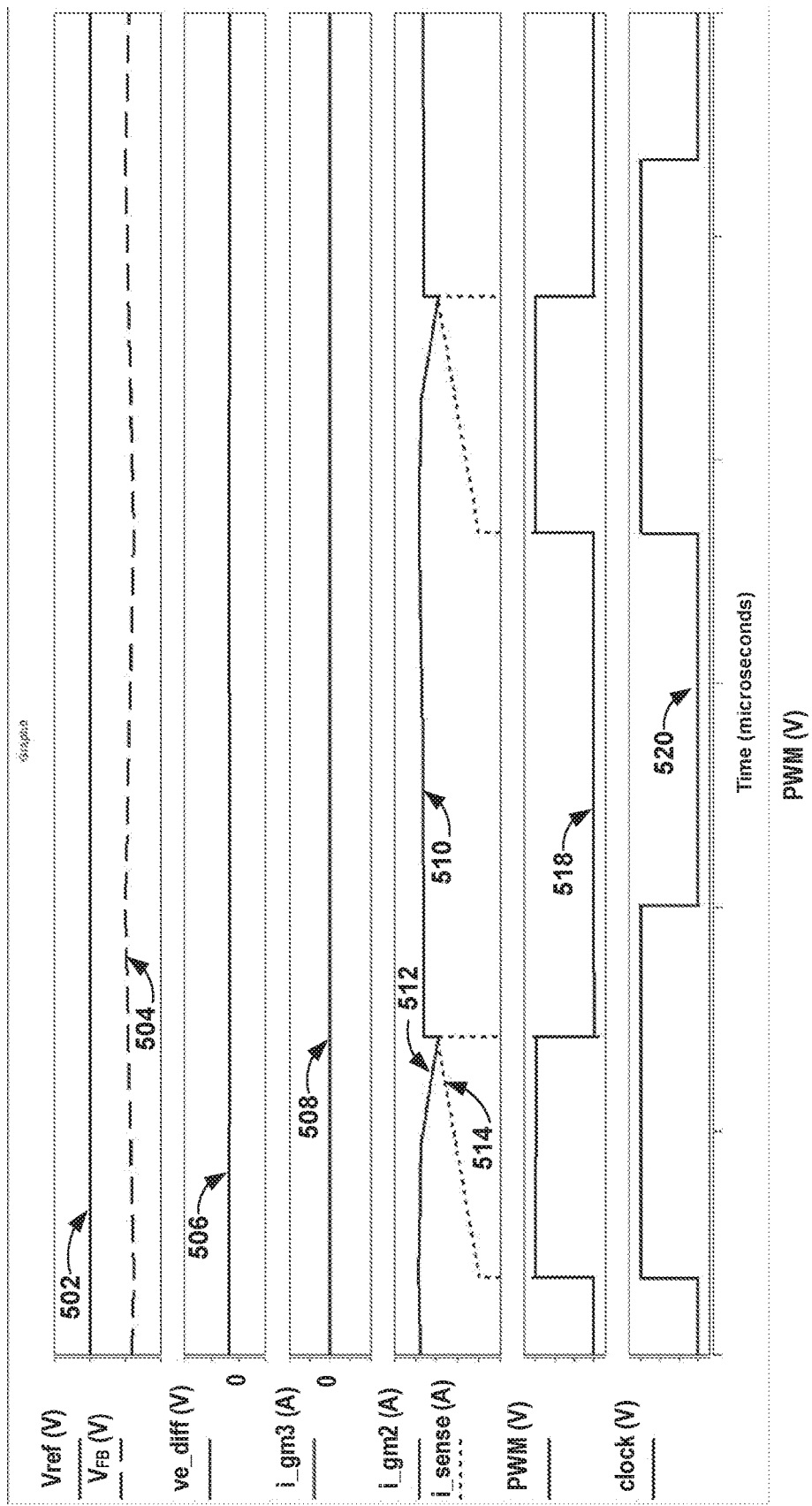
FIG. 5 is a timing diagram illustrating an example pulse width modulation operation of the control circuitry of this disclosure.

FIG. 5 is a timing diagram illustrating an example pulse width modulation operation of the control circuitry of this disclosure. The graphs of FIGS. 5-7 describe the working principle of system 100A and 100B described above in relation to FIGS. 1A and 1B. The example of FIG. 5 describes the operation when ve_diff>0, e.g. Vout is less than Vref.

For a fixed input voltage, e.g. Vin 410 depicted in FIG. 4A, the system may reach equilibrium when vfb 504 is slightly lower than vref 502. In such condition the fully differential error amplifier, which compares vref 502 and vfb 504, may output a positive differential voltage 506. Because ve_diff 506 is positive, the transconductor gm3 is deactivated, and the output current i_gm3 508 is zero amps. Thus, the CCO gives a clock output 520 with a fixed switching period, determined only by i_clock, as described above in relation to FIG. 1B.

Transconductor gm2 may see a positive input voltage equal to ve_diff 506, and outputs current i_gm2 510 equal in this case to ve_diff*gm2. This current is the reference current for the peak current control circuit, which includes current sense 144, slope compensation circuitry 142, peak detector 140 as well as AND gate 138, described above in relation to FIG. 1A.

Therefore, the duty-cycle of the power converter is controlled by i_gm2. The PWM signal 518 from differential control circuit 180B is set high by the rising edge of clock 520, while a reset happens when the sense current 514 is equal to i_gm2 510 minus the slope compensation current 512.

Figure 6:
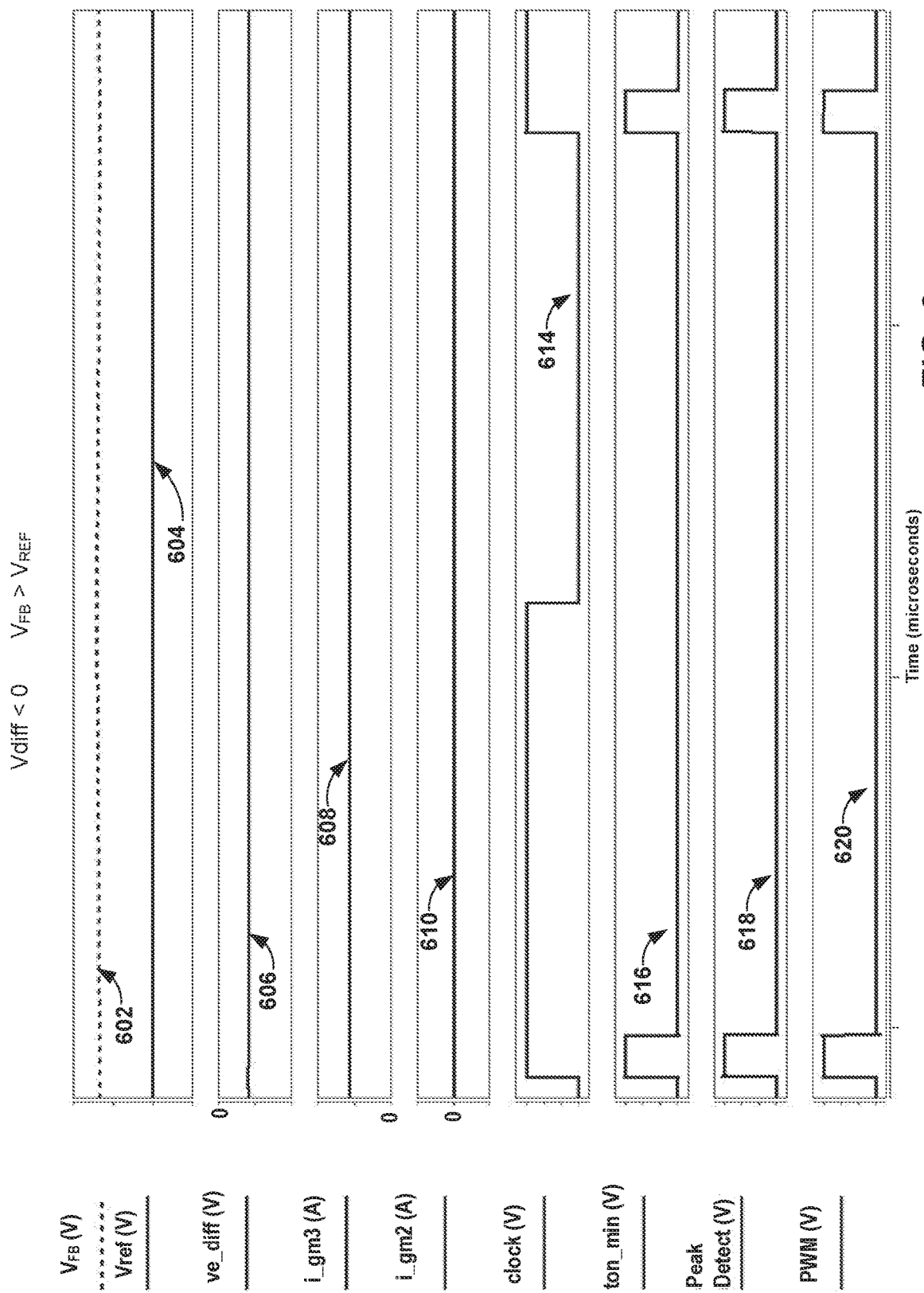
FIG. 6 is a timing diagram illustrating an example pulse frequency modulation operation of the control circuitry of this disclosure.

FIG. 6 is a timing diagram illustrating an example pulse frequency modulation operation of the control circuitry of this disclosure. If external conditions force the power converter to operate at a very low duty-cycle, peak detection may happen at very beginning of clock period, thus inside the duration of ton_min. If this happens, the circuit ignores peak detection and duty-cycle is no longer modulated by changing the on time. Instead, the on time of the output control signal may be is fixed and equal to ton_min, but the circuit modulates the switching frequency, e.g. PFM mode.

As shown in FIG. 6, the system finds its equilibrium with a feedback voltage, vfb 602 slightly higher than reference voltage vref 604. Under these conditions the fully differential error amplifier may output a negative voltage ve_diff 606. In other words, as described above in relation to FIGS. 1A-2, ve_n is higher than ve_p. Because ve_diff 606 negative, i_gm2 610 is equal to zero forcing peak detection to happen at the beginning of each switching cycle. Transconductor gm3 may receive a positive input voltage and therefore output a current i_gm3 608 greater than 0 A. The input current of the current controlled oscillator is the difference of the fixed current i_clock and i_gm3 608. Under these conditions, CCO may output a clock 614 with a lower frequency with respect to PWM 620, because the input current is lower. Therefore, the fully differential error amplifier may now control ve_diff 606 to modify the switching period tsw such that the duty-cycle (equal to ton_min/tsw) is used keep the output voltage of the power converter constant.

In some examples, if the external conditions changes, for example load current demand for the power converter is reduced, the differential control circuit may reacts and adapt i_gm3 608 to output a new switching frequency that gives the proper duty-cycle to keep the output voltage constant.

Figure 7:
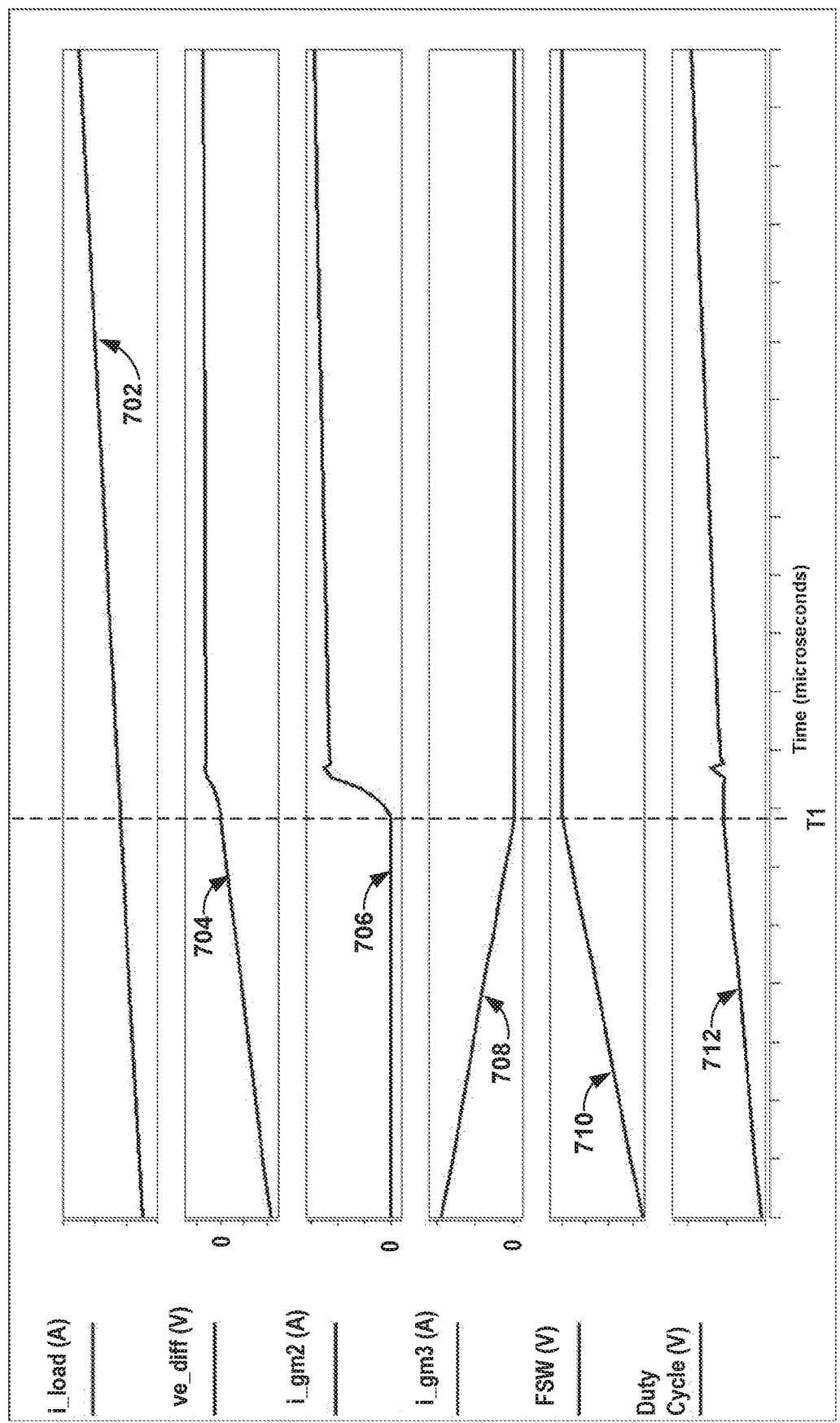
FIG. 7 is a timing diagram illustrating an example operation of the control circuitry of this disclosure switching from pulse frequency modulation to pulse width modulation mode.

FIG. 7 is a timing diagram illustrating an example operation of the control circuitry of this disclosure switching from pulse frequency modulation to pulse width modulation mode. In the example of FIG. 7, load current, i_load 702 increases with a steady ramp over time. As i_load 702 increase toward time T1, ve_diff 704 increases from a negative value toward zero, i_gm3 708 decreases toward zero and the switching frequency increases. Before time T1, differential control circuitry, e.g. differential control circuitry 180B described above in relation to FIG. 1B, may control the power converter circuitry in pulse frequency modulation mode.

At approximately time T1, ve_diff 704 may approximately equal zero and start becoming a positive value, which may cause i_gm3 to turn off and output zero amps. The constant current from i_clock, described above in relation to FIG. 1B, causes switching frequency from the CCO after time T1 to a steady state value. As i_load 702 continues to increase after time T1, ve_diff 704 becomes positive and as depicted in FIGS. 1B and 2, the differential control circuitry begins controlling the power converter in pulse width modulation mode. As i_gm2 706 increases, the peak current control circuit components, e.g. current sense 144, slope compensation circuitry 142 and peak detector 140, begin modulating the pulse width modulation output of the differential control circuitry.

Figure 8:
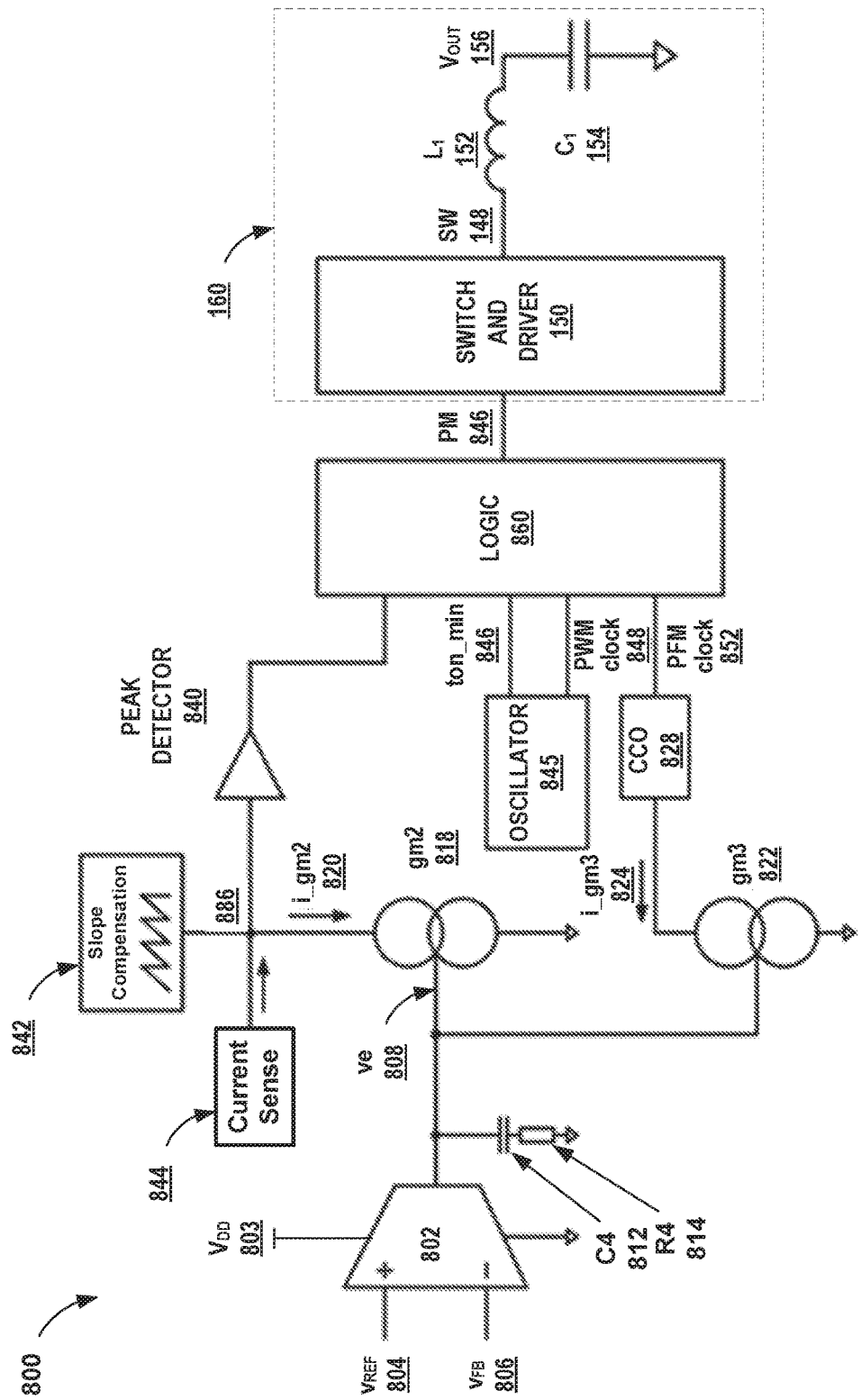
FIG. 8 is a schematic diagram illustrating example control circuitry for a power converter.

FIG. 8 is a schematic diagram illustrating example control circuitry for a power converter. In contrast to the fully differential amplifier and the differential control circuitry of this disclosure, system 800 in the example of FIG. 8 includes a single output differential amplifier 802 with a compensation unit including resistor R4 814 and capacitor C4 812. Amplifier 802 connects to a system ground and is supplied by Vdd 803. Also, system 800 includes a second oscillator 845, in addition to CCO 828. Oscillator 845 produces $t_{ON\_MIN}$ 846 and the clock 848 for PWM mode. CCO 828 generates the clock 852 for PFM mode based on the magnitude of i_gm3 824, which is controlled by error voltage, ve 808. The error voltage, ve 808 may be based on the relative magnitude difference between Vref 804 and feedback voltage, Vfb 806.

Similar to system 100A and 100B described above in relation to FIGS. 1A and 1B, system 800 includes peak current control circuitry, including current sense circuit 844, slope compensation circuitry 842 and peak detector 840. Transconductor gm2 818 may sink a current i_gm2 820 from current summing node 886. The magnitude of i_gm2 820 may also be based on the relative magnitude difference between Vref 804 and feedback voltage, Vfb 806. However, system 800 may include logic circuitry 860 to manage the input signals, e.g. the output of peak detector 840, $t_{ON\_MIN}$ 846, PWM clock 848, and PFM clock 852 so output signals from output terminal PM 846 control power converter circuitry 160 in PFM mode when ve 808 is below a threshold voltage and PWM mode when ve 808 is positive and above a second threshold voltage.

Figure 9:
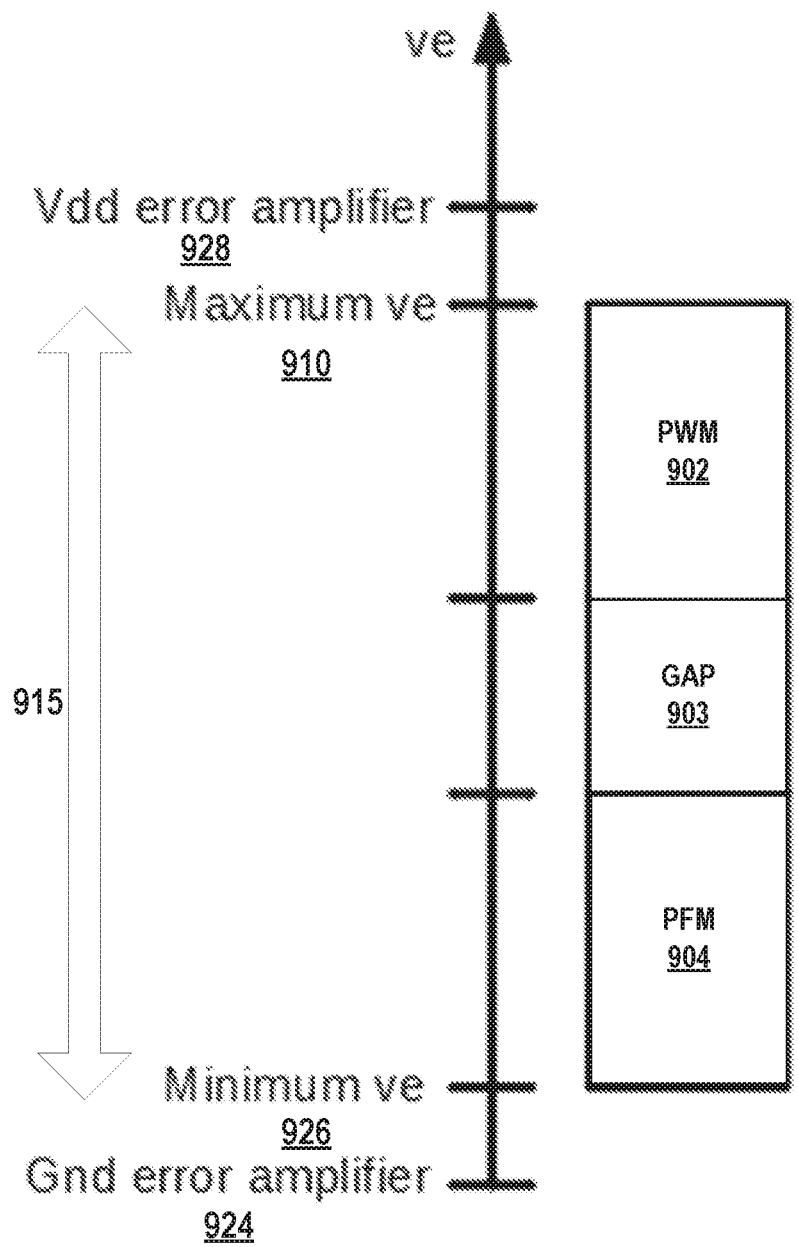
FIG. 9 is a conceptual diagram illustrating an example operation of a power converter control circuitry including a gap between the pulse frequency modulation and pulse width modulation modes.

FIG. 9 is a conceptual diagram illustrating an example operation of a power converter control circuitry of system 800, including a gap between the pulse frequency modulation and pulse width modulation modes. FIG. 9 will be described in terms of FIG. 8, unless otherwise noted. In operation, error amplifier 802 of system 800 may compare output voltage, Vout 156 of the power converter, with reference current Vref 804 and output error voltage ve 808. Vfb 806 may electrically connect to Vout 156 (not shown in FIG. 8).

Error signal ve 808 drives two transconductors, gm2 818 and gm3 822. Transconductor gm2 generates the reference current for a peak current control, as described above in relation to FIG. 8. Transconductor gm3 822 drives a current-controlled oscillator, CCO 828, for PFM mode operation, while oscillator 845 provides PWM clock 848 for PWM mode operation.

The power supply Vdd 928, which corresponds to Vdd 803 depicted in FIG. 8, and system ground 924 set the voltage range 915 of operation for the error amplifier. Error amplifier 802 may operate in voltage range 915 between a maximum ve 910 and a minimum ve 926, which may be within the range of Vdd 928 and system ground 924. In some examples, maximum ve 910 and minimum ve 926, may be predetermined operating threshold, where the error amplifier itself can operate properly, and may be dependent on error amplifier topology. Inside this allowed range 915, error amplifier 802 may operate in three different regions: one for PWM 902, one for PFM 904 and a GAP 903.

When ve 808 is in the PWM 902 region, PFM clock 852 may have a higher frequency with respect to PWM clock 848, thus logic 860 may cause the signal at output terminal PM 846 to use PWM clock 848 to control power converter 160. The duty-cycle of PWM clock 848 is modulated by i_gm2 820, which is the reference current for the peak current control.

When ve 808 is inside the PFM 904 region, PFM clock 852 may have a lower frequency with respect to PWM clock 848, thus logic 860 may cause the signal at output terminal PM 846 to use PFM clock 852 to control power converter 160. When ve 808 is inside the PFM 904 region, i_gm2 820 may be at a very low magnitude, e.g., sinking a small magnitude of current from summing node 883. Therefore, the peak detection by peak detector 840 may happens at the beginning of the switching cycle, e.g., inside the minimum on time ton_min 846. When the peak detection is within the duration of ton_min 846, logic 860 may ignore the peak detection signal output by peak detector 840 and set the on time of the PFM signal at output terminal PM 846 equal to ton_min. Then the duty-cycle for dc-dc power converter 160 may be modulated by changing the switching period, e.g. tsw 420, as described above in relation to FIG. 4B.

If ve 808 is inside the GAP 903 region, there is no duty-cycle modulation. When in the GAP 903 region, PFM clock 852 may have a higher switching frequency with respect to PWM clock 848. Thus logic 860 may select PWM clock 848 to control the power converter and the switching period, tsw may be constant. On the other hand, i_gm2 818 may be at a low magnitude, causing peak detection happens inside the minimum on time, causing logic 860 to ignore the peak detection signal output by peak detector 840. Because of a constant on time and a constant switching period the duty-cycle is constant, thus the output voltage of the power converter may not be controlled in the GAP 903 region.

In contrast, a system with the fully differential amplifier and differential control circuitry of this disclosure may provide advantages over system 800, and other power converter control techniques. For example, the signal to noise ratio (SNR) for differential control circuit of this disclosure, may be an improvement over the SNR for system 800 because the allowed voltage swing of the error voltage ve 808 must be split for the three regions for system 800, rather than two regions for the differential control circuit, as described above in relation to FIG. 2. Assuming an equal noise level during operation of system 800 and the differential control circuit of system 100A and 100B described above in relation to FIGS. 1A and 1B, ideally a maximum swing of the error amplifier output equals the range of the supply for the error amplifier. For system 800, the signal swing for PWM changes from one third of the operating range 915 between Vdd 928 and system ground 924. In contrast, for the range of operation for PWM for the differential control circuitry is the entire range between Vdd 208 and zero volts, or system ground, as described above in relation to FIG. 2. Thus, SNR for the differential control circuitry of this disclosure may be be ideally three times higher than for PWM operation in system 800. The comparison for PFM operations would have a similar SNR. Also, the GAP 903 between PWM and PFM mode may be at zero volts and be approximately zero volts wide for the differential control circuitry of this disclosure. In the differential control circuitry, the transition from one mode to the other, e.g. PFM to PWM, happens when ve_diff crosses zero volts, independent from i_clock, the output of gm2 and gm3 transconductance units and other parameters.

Additional advantages may include that the control logic may be very simple, e.g. AND gate 138 and RS flip-flop 132 described above in relation to FIG. 1B. Also, system 100B includes only one oscillator, e.g. CCO 128, which may reduce cost, complexity, improve reliability and for control circuitry implemented on an integrated circuit, may consume less area.

Figure 10:
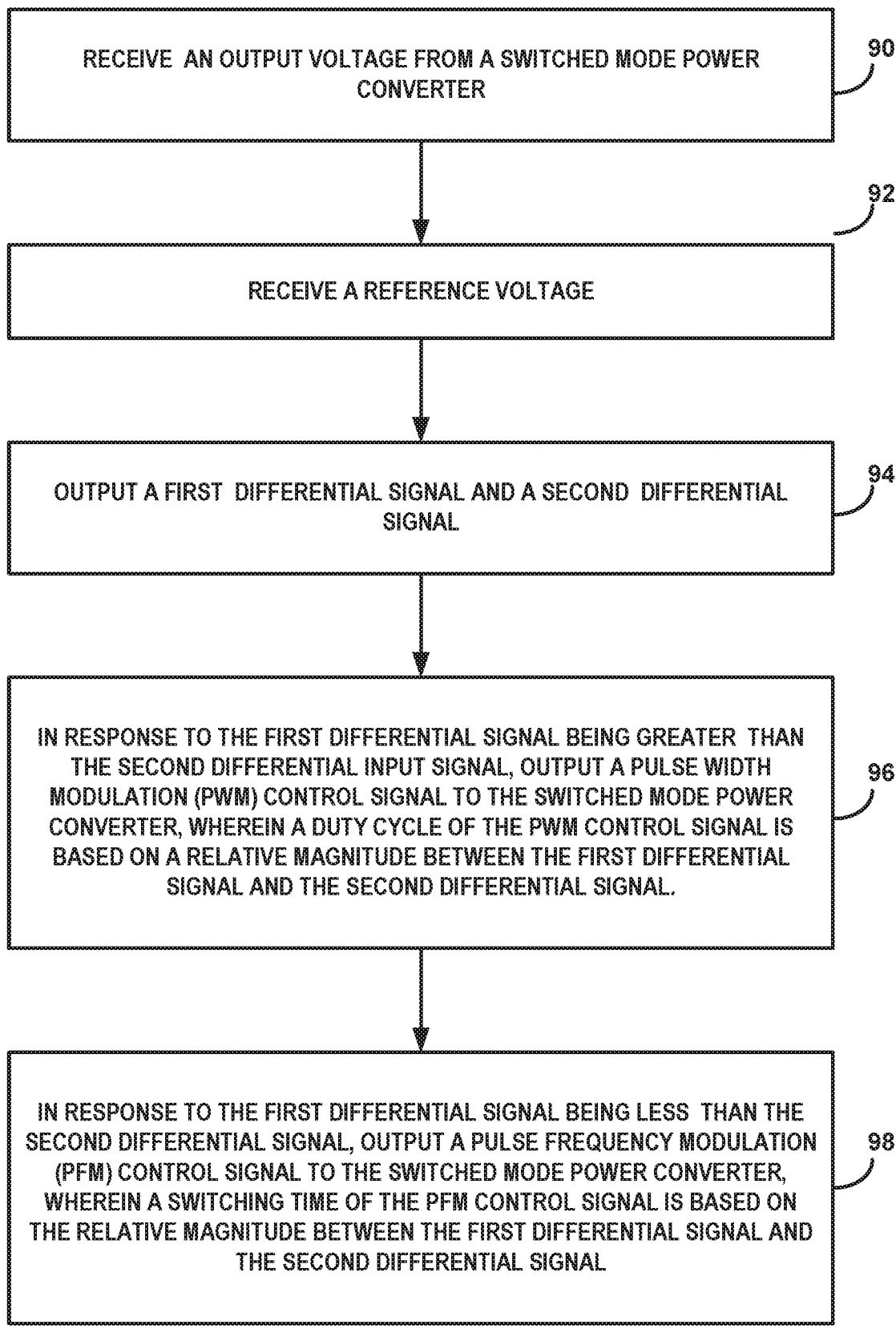
FIG. 10 is a flow diagram illustrating an example operation of the control circuitry according to one or more techniques of this disclosure.

FIG. 10 is a flow diagram illustrating an example operation of the control circuitry according to one or more techniques of this disclosure. The blocks of FIG. 10 will be described in terms of FIGS. 1B and 2, unless otherwise noted.

Dual output difference amplifier 102 may receive output voltage, Vout 156 from a switched mode power converter at a feedback voltage terminal, Vfb 106 (90). Vfb 106 is the inverting input terminal of differential amplifier 102. Difference amplifier 102 may also receive reference voltage, Vref 104 at the non-inverting input (92).

Difference amplifier 102 may output two differential signals, ve_p 108 and ve_n 110 (94). The magnitude of ve_p 108 and ve_n 110 may depend on the relative difference between the output voltage from the power converter and the reference voltage as described above in relation to FIG. 3D. For example, the first differential signal ve_p 108 may be greater than the second differential signal ve_n 110 when reference voltage Vref 104 is greater than Vfb 106, which is coupled to the output of power converter 160.

In response to the first differential signal ve_p 108 being greater than the second differential input signal ve_n 110, differential control circuitry 180B may output a pulse width modulation (PWM) control signal to the switched mode power converter 160 (96). The duty cycle of the PWM control signal may be based on the relative magnitude between ve_p 108 and ve_n 110.

Also, in response to the first differential signal ve_p 108 being less than the second differential signal ve_n 110, differential control circuitry 180B may output a pulse frequency modulation (PFM) control signal to power converter 160 (98). The switching time of the PFM control signal may be based on the relative magnitude between ve_p 108 and ve_n 110.

The techniques of this disclosure may also be described in the following examples:

Example 1: A circuit comprising a first input terminal configured to receive a first differential input signal; a second input terminal configured to receive a second differential input signal; a current sink input terminal configured to sink an electrical current based on a relative magnitude between the first differential input signal and the second differential input signal; a peak detected input terminal configured to receive a logical signal from a peak detector circuit; an output terminal configured to control a power converter, wherein the circuit is configured to: in response to the first differential input signal being greater than the second differential input signal: sink the electrical current at the current sink input terminal; output a pulse width modulation (PWM) control signal at the output terminal, wherein a duty cycle of the PWM control signal is based on a relative magnitude between the first differential input signal and the second differential input signal; and in response to the first differential input signal being less than the second differential input signal, output a pulse frequency modulation (PFM) control signal at the output terminal, wherein a switching time of the PFM control signal is based on the relative magnitude between the first differential input signal and the second differential input signal.

Example 2: The circuit of example 1, further comprising a dual output difference amplifier configured to: receive an output voltage from the power converter; receive a reference voltage; output the first differential input signal to the first input terminal; and output the second differential input signal to the second input terminal, wherein: a magnitude of the first differential input signal is based on a relative difference between the output voltage from the power converter and the reference voltage, a magnitude of the second differential input signal is based on the relative difference between the output voltage from the power converter and the reference voltage, and the first differential input signal is greater than the second differential input signal when the reference voltage is greater than the output voltage from the power converter.

Example 3: The circuit of any combination of examples 1-2, wherein in response to the first differential input signal being less than the second differential input signal, the circuit is further configured to: prevent the current sink input terminal from sinking the electrical current, and wherein to sink approximately zero electrical current at the current sink input terminal causes the logical signal at the peak detector circuit to be set to a logical ONE.

Example 4: The circuit of any combination of examples 1-3, wherein the circuit further comprises a first transconductance unit configured to sink the electrical current at the current sink input terminal in response to the first differential input signal being greater than the second differential input signal, wherein a magnitude of the electrical current is based on the relative magnitude between the first differential input signal and the second differential input signal, wherein the duty cycle of the PWM control signal is based on the magnitude of the electrical current through the first transconductance unit, and wherein the magnitude of the electrical current is approximately zero in response to the first differential input signal being less than the second differential input signal.

Example 5. The circuit of any combination of examples 1-4, further comprising a slope compensation unit coupled to a peak detector and to the current sink input terminal, wherein the peak detector is configured to output the logical signal to the peak detected input terminal.

Example 6: The circuit of any combination of examples 1-5, further comprising a current sense circuit coupled to a peak detector and to the current sink input terminal, wherein the logical signal from the peak detector is based on a magnitude of current at the current sink input terminal.

Example 7: The circuit of any combination of examples 1-6, wherein the electrical current is a first electrical current, wherein the circuitry further comprises a second transconductance unit configured to sink a second electrical current separate from the first electrical current, in response to the first differential input signal being less than the second differential input signal, wherein a magnitude of the second electrical current is based on the relative magnitude between the first differential input signal and the second differential input signal, and wherein the magnitude of the second electrical current is approximately zero in response to the first differential input signal being greater than the second differential input signal.

Example 8: The circuit of any combination of examples 1-7, wherein the switching time of the PFM control signal is based on the magnitude of the second electrical current.

Example 9: The circuit of any combination of examples 1-8, wherein the circuit further comprises a current controlled oscillator configured to: receive an input current comprising a difference between a third electrical current from a current source and the second electrical current; and output a clock signal, wherein a frequency of the clock signal is based on the difference between the third electrical current and the second electrical current, and wherein the switching time of the PFM control signal is based on the frequency of the clock signal.

Example 10: The circuit of any combination of examples 1-9, further comprising a compensation unit coupled to the first input terminal and the second input terminal, wherein the compensation unit is configured to control the response time and stability of the circuit.

Example 11: A system comprising a power converter; a dual output difference amplifier configured to: receive an output voltage from the power converter; receive a reference voltage; output a first differential signal; and output a second differential signal. The system also includes a differential control circuit comprising a first input terminal and a second input terminal and configured to: receive the first differential signal at the first input terminal; receive the second differential signal at the second input terminal; and control the operation of the power converter, wherein: in response to the first differential signal being greater than the second differential input signal, output a pulse width modulation (PWM) control signal to the power converter, wherein a duty cycle of the PWM control signal is based on a relative magnitude between the first differential signal and the second differential signal; and in response to the first differential signal being less than the second differential signal, output a pulse frequency modulation (PFM) control signal to the power converter, wherein a switching time of the PFM control signal is based on the relative magnitude between the first differential signal and the second differential signal.

Example 12: The system of example 11, further comprising a slope compensation circuit.

Example 13: The system of any combination of examples 11-12, wherein the differential control circuit further comprises a first transconductance unit and a second transconductance unit, wherein the first transconductance unit is configured to sink a first electrical current from the current sink terminal in response to the first differential signal being greater than the second differential signal, wherein a magnitude of the first electrical current is based on the relative magnitude between the first differential signal and the second differential signal, wherein the magnitude of the first electrical current is approximately zero in response to the first differential signal being less than the second differential signal, wherein the second transconductance unit is configured to sink a second electrical current separate from the first electrical current, in response to the first differential signal being less than the second differential signal, wherein a magnitude of the second electrical current is based on the relative magnitude between the first differential signal and the second differential signal, and wherein the magnitude of the second electrical current is approximately zero in response to the first differential signal being greater than the second differential signal.

Example 14: The system of any combination of examples 11-13, wherein the differential control circuit further comprises a current controlled oscillator configured to: receive an input current comprising a difference between a third electrical current from a current source and the second electrical current; and output a clock signal, wherein a frequency of the clock signal is based on the difference between the third electrical current and the second electrical current, and wherein the switching time of the PFM control signal is based on the frequency of the clock signal.

Example 15: The system of any combination of examples 11-14, wherein in response to the first differential input signal being less than the second differential input signal the first transconductance unit is configured to sink approximately zero electrical current and therefore the first electrical current from the current sink terminal is approximately zero, and wherein to sink approximately zero electrical current at the current sink input terminal causes the logical signal to be set to a logical ONE.

Example 16: The system of any combination of examples 11-15, wherein the power converter comprises a buck converter.

Example 17: A method comprising receiving, by a dual output difference amplifier, an output voltage from a power converter; receiving, by the dual output difference amplifier, a reference voltage; outputting, by the dual output difference amplifier, a first differential signal and a second differential signal, wherein: a magnitude of the first differential signal is based on a relative difference between the output voltage from the power converter and the reference voltage, a magnitude of the second differential signal is based on the relative difference between the output voltage from the power converter and the reference voltage, and the first differential signal is greater than the second differential signal when the reference voltage is greater than the output voltage from the power converter; and in response to the first differential signal being greater than the second differential signal, outputting a pulse width modulation (PWM) control signal to the power converter, wherein a duty cycle of the PWM control signal is based on a relative magnitude between the first differential signal and the second differential signal.

Example 18: The method of example 1, further comprising, in response to the first differential signal being less than the second differential signal, outputting a pulse frequency modulation (PFM) control signal to the power converter, wherein a switching time of the PFM control signal is based on the relative magnitude between the first differential signal and the second differential signal.

Example 19: The method of example 18, further comprising in response to the first differential signal being greater than the second differential signal, sinking a first electrical current by a first transconductance unit, wherein a magnitude of the first electrical current is based on the relative magnitude between the first differential signal and the second differential signal, wherein the magnitude of the first electrical current is approximately zero in response to the first differential signal being less than the second differential signal, in response to the first differential signal being less than the second differential signal, sinking, by a second transconductance unit a second electrical current separate from the first electrical current, wherein a magnitude of the second electrical current is based on the relative magnitude between the first differential signal and the second differential signal, and wherein the magnitude of the second electrical current is approximately zero in response to the first differential signal being greater than the second differential signal.

Example 20: The system of any combination of examples 17-19, further comprising receiving, by a current controlled oscillator, an input current comprising a difference between a third electrical current from a current source and the second electrical current; outputting, by the current controlled oscillator, a clock signal, wherein a frequency of the clock signal is based on the difference between the third electrical current and the second electrical current, and wherein the switching time of the PFM control signal is based on the frequency of the clock signal.

Various examples of the disclosure have been described. These and other examples are within the scope of the following claims.

What is claimed is:
1. A circuit comprising:
   a first input terminal configured to receive a first differential input signal;
   a second input terminal configured to receive a second differential input signal;
   a current sink input terminal configured to sink an electrical current based on a relative magnitude between the first differential input signal and the second differential input signal;
   a peak detected input terminal configured to receive a logical signal from a peak detector circuit; and
   an output terminal configured to control a power converter, wherein the circuit is configured to:
      in response to the first differential input signal being greater than the second differential input signal:
         sink the electrical current at the current sink input terminal; and
         output a pulse width modulation (PWM) control signal at the output terminal, wherein a duty cycle of the PWM control signal is based on a relative magnitude between the first differential input signal and the second differential input signal; and
      in response to the first differential input signal being less than the second differential input signal, output a pulse frequency modulation (PFM) control signal at the output terminal, wherein a switching time of the PFM control signal is based on the relative magnitude between the first differential input signal and the second differential input signal.

2. The circuit of claim 1, further comprising a dual output difference amplifier configured to:
   receive an output voltage from the power converter;
   receive a reference voltage;
   output the first differential input signal to the first input terminal; and
   output the second differential input signal to the second input terminal,
   wherein:
      a magnitude of the first differential input signal is based on a relative difference between the output voltage from the power converter and the reference voltage,
      a magnitude of the second differential input signal is based on the relative difference between the output voltage from the power converter and the reference voltage, and
      the first differential input signal is greater than the second differential input signal when the reference voltage is greater than the output voltage from the power converter.

3. The circuit of claim 1, wherein in response to the first differential input signal being less than the second differential input signal, the circuit is further configured to prevent the current sink input terminal from sinking the electrical current, and wherein to sink approximately zero electrical current at the current sink input terminal causes the logical signal at the peak detector circuit to be set to a logical ONE.

4. The circuit of claim 1,
   wherein the circuit further comprises a first transconductance unit configured to sink the electrical current at the current sink input terminal in response to the first differential input signal being greater than the second differential input signal,
wherein a magnitude of the electrical current is based on the relative magnitude between the first differential input signal and the second differential input signal,
wherein the duty cycle of the PWM control signal is based on the magnitude of the electrical current through the first transconductance unit, and
wherein the magnitude of the electrical current is approximately zero in response to the first differential input signal being less than the second differential input signal.

5. The circuit of claim 4, further comprising a slope compensation unit coupled to a peak detector and to the current sink input terminal, wherein the peak detector is configured to output the logical signal to the peak detected input terminal.

6. The circuit of claim 5, further comprising a current sense circuit coupled to a peak detector and to the current sink input terminal, wherein the logical signal from the peak detector is based on a magnitude of current at the current sink input terminal.

7. The circuit of claim 4,
wherein the electrical current is a first electrical current,
wherein the circuitry further comprises a second transconductance unit configured to sink a second electrical current separate from the first electrical current, in response to the first differential input signal being less than the second differential input signal,
wherein a magnitude of the second electrical current is based on the relative magnitude between the first differential input signal and the second differential input signal, and
wherein the magnitude of the second electrical current is approximately zero in response to the first differential input signal being greater than the second differential input signal.

8. The circuit of claim 7, wherein the switching time of the PFM control signal is based on the magnitude of the second electrical current.

9. The circuit of claim 7, wherein the circuit further comprises a current controlled oscillator configured to:
receive an input current comprising a difference between a third electrical current from a current source and the second electrical current; and
output a clock signal,
wherein a frequency of the clock signal is based on the difference between the third electrical current and the second electrical current, and
wherein the switching time of the PFM control signal is based on the frequency of the clock signal.

10. The circuit of claim 1, further comprising a compensation unit coupled to the first input terminal and the second input terminal, wherein the compensation unit is configured to control the response time and stability of the circuit.

11. A system comprising:
a power converter;
a dual output difference amplifier configured to:
receive an output voltage from the power converter;
receive a reference voltage;
output a first differential signal; and
output a second differential signal; and
a differential control circuit comprising a first input terminal and a second input terminal and configured to:
receive the first differential signal at the first input terminal;
receive the second differential signal at the second input terminal; and
control the operation of the power converter, wherein:
in response to the first differential signal being greater than the second differential input signal, output a pulse width modulation (PWM) control signal to the power converter, wherein a duty cycle of the PWM control signal is based on a relative magnitude between the first differential signal and the second differential signal; and
in response to the first differential signal being less than the second differential signal, output a pulse frequency modulation (PFM) control signal to the power converter, wherein a switching time of the PFM control signal is based on the relative magnitude between the first differential signal and the second differential signal.

12. The system of claim 11, further comprising a slope compensation circuit.

13. The system of claim 11,
wherein the differential control circuit further comprises a first transconductance unit and a second transconductance unit,
wherein the first transconductance unit is configured to sink a first electrical current from the current sink terminal in response to the first differential signal being greater than the second differential signal,
wherein a magnitude of the first electrical current is based on the relative magnitude between the first differential signal and the second differential signal,
wherein the magnitude of the first electrical current is approximately zero in response to the first differential signal being less than the second differential signal,
wherein the second transconductance unit is configured to sink a second electrical current separate from the first electrical current, in response to the first differential signal being less than the second differential signal,
wherein a magnitude of the second electrical current is based on the relative magnitude between the first differential signal and the second differential signal, and
wherein the magnitude of the second electrical current is approximately zero in response to the first differential signal being greater than the second differential signal.

14. The system of claim 13, wherein the differential control circuit further comprises a current controlled oscillator configured to:
receive an input current comprising a difference between a third electrical current from a current source and the second electrical current; and
output a clock signal,
wherein a frequency of the clock signal is based on the difference between the third electrical current and the second electrical current, and
wherein the switching time of the PFM control signal is based on the frequency of the clock signal.

15. The system of claim 13,
wherein in response to the first differential input signal being less than the second differential input signal the first transconductance unit is configured to sink approximately zero electrical current and therefore the first electrical current from the current sink terminal is approximately zero, and
wherein to sink approximately zero electrical current at the current sink input terminal causes the logical signal to be set to a logical ONE.

16. The system of claim 11, wherein the power converter comprises a buck converter.

17. A method comprising:
receiving, by a dual output difference amplifier, an output voltage from a power converter;
receiving, by the dual output difference amplifier, a reference voltage;
outputting, by the dual output difference amplifier, a first differential signal and a second differential signal, wherein:
a magnitude of the first differential signal is based on a relative difference between the output voltage from the power converter and the reference voltage,
a magnitude of the second differential signal is based on the relative difference between the output voltage from the power converter and the reference voltage, and
the first differential signal is greater than the second differential signal when the reference voltage is greater than the output voltage from the power converter; and
in response to the first differential signal being greater than the second differential signal, outputting a pulse width modulation (PWM) control signal to the power converter, wherein a duty cycle of the PWM control signal is based on a relative magnitude between the first differential signal and the second differential signal.

18. The method of claim 17, further comprising, in response to the first differential signal being less than the second differential signal, outputting a pulse frequency modulation (PFM) control signal to the power converter, wherein a switching time of the PFM control signal is based on the relative magnitude between the first differential signal and the second differential signal.

19. The method of claim 18, further comprising:
in response to the first differential signal being greater than the second differential signal, sinking a first electrical current by a first transconductance unit,
wherein a magnitude of the first electrical current is based on the relative magnitude between the first differential signal and the second differential signal,
wherein the magnitude of the first electrical current is approximately zero in response to the first differential signal being less than the second differential signal,
in response to the first differential signal being less than the second differential signal, sinking, by a second transconductance unit a second electrical current separate from the first electrical current,
wherein a magnitude of the second electrical current is based on the relative magnitude between the first differential signal and the second differential signal, and
wherein the magnitude of the second electrical current is approximately zero in response to the first differential signal being greater than the second differential signal.

20. The method of claim 19, further comprising:
receiving, by a current controlled oscillator, an input current comprising a difference between a third electrical current from a current source and the second electrical current; and
outputting, by the current controlled oscillator, a clock signal,
wherein a frequency of the clock signal is based on the difference between the third electrical current and the second electrical current, and
wherein the switching time of the PFM control signal is based on the frequency of the clock signal.

* * * * *